United States Patent
Joo et al.

(10) Patent No.: US 8,726,828 B2
(45) Date of Patent: May 20, 2014

(54) COATING APPARATUS HAVING COATER CHUCK

(75) Inventors: Dong-Young Joo, Namyul-Ri (KR); Tae-Jung Kan, Goyang (KR)

(73) Assignee: LG Display Co., Ltd., Seoul (KR)

( * ) Notice: Subject to any disclaimer, the term of this patent is extended or adjusted under 35 U.S.C. 154(b) by 559 days.

(21) Appl. No.: 12/842,728

(22) Filed: Jul. 23, 2010

(65) Prior Publication Data

US 2011/0017129 A1 Jan. 27, 2011

(30) Foreign Application Priority Data

Jul. 24, 2009 (KR) ........................ 10-2009-0067976

(51) Int. Cl.
*B05C 5/02* (2006.01)
*G03F 7/16* (2006.01)

(52) U.S. Cl.
CPC ............... *B05C 5/0208* (2013.01); *G03F 7/16* (2013.01); *G03F 7/162* (2013.01)
USPC ............... 118/52; 118/56; 118/319; 118/320; 118/500

(58) Field of Classification Search
CPC .......... B05C 5/0208; G03F 7/16; G03F 7/162
USPC ............... 118/52, 56, 319, 320, 500; 427/240
See application file for complete search history.

(56) References Cited

U.S. PATENT DOCUMENTS

| | | | |
|---|---|---|---|
| 5,688,322 A * | 11/1997 | Motoda et al. | 118/52 |
| 7,358,465 B2 * | 4/2008 | Fujii | 219/543 |
| 2004/0058067 A1 * | 3/2004 | Law et al. | 427/240 |
| 2006/0032586 A1 * | 2/2006 | Choi et al. | 156/345.51 |
| 2006/0292295 A1 * | 12/2006 | Kwon et al. | 427/162 |

FOREIGN PATENT DOCUMENTS

| | | |
|---|---|---|
| KR | 1020050009217 A | 1/2005 |
| KR | 1020060000444 A | 1/2006 |
| KR | 10-2006-0051365 | 5/2006 |

* cited by examiner

*Primary Examiner* — Laura Edwards
(74) *Attorney, Agent, or Firm* — Brinks Gilson & Lione

(57) ABSTRACT

Disclosed is a coating apparatus having a coater chuck capable of improving a photoresist coating uniformity by preventing the coater chuck for performing a photoresist coating process from being sunk, in a manner of employing a different type of a material for making the coater chuck, wherein the coater chuck is made of stone and connected to a servo motor via a drive shaft, the driving shaft being movable up and down, and a glass substrate coated with photoresist through a slit nozzle is placed on the coater chuck.

4 Claims, 5 Drawing Sheets

| | G1 | G2 | G3 | SPACING PROBABILITY | COATED AMOUNT |
|---|---|---|---|---|---|
| TEST | 300 | 150 | 300 | 50.3% | 64g |
| | 400 | 270 | 300 | | |
| | 470 | 290 | 380 | | |

| | G1 | G2 | G3 | SPACING PROBABILITY | COATED AMOUNT |
|---|---|---|---|---|---|
| | 310 | 320 | 340 | | |
| TEST | 300 | 350 | 340 | 19.8% | 50g |
| | 280 | 350 | 350 | | |

COATING APPARATUS HAVING COATER CHUCK

BACKGROUND

1. Field of the Disclosure

The present disclosure relates to a coating apparatus for a liquid crystal display (LCD) device, and particularly, to a coating apparatus having a coater chuck capable of improving a photoresist coating uniformity by preventing the sink of the coater chuck for performing a photoresist coating process in a manner of using a different type of material for making the coater chuck

2. Background of the Disclosure

A photolithography process for fabricating a semiconductor device or an LCD panel includes a coating process for coating a photoresist on a substrate, for example, a wafer, a glass and a mask, an exposure process of shifting the coated substrate into a device and printing a mask circuit in a circular shape onto the coated substrate, and a development process.

A photolithography process for fabricating a semiconductor device or an LCD panel includes a coating process for coating a photoresist on a substrate, for example, a wafer, a glass and a mask, an exposure process of shifting the coated substrate into a device and printing a mask circuit in a circular shape onto the coated substrate, and a development process.

FIG. 1 is an overview schematically showing a coating apparatus used in a coating process according to the related art.

FIG. 2 is an enlarged overview of a coater chuck present in the coating apparatus used in the coating process according to the related art.

FIG. 3 is an overview showing distances spaced between the coater chuck and a slit nozzle provided in the coating apparatus according to the related art.

FIG. 4 is a table showing spaced distances between the slit nozzle and the coater chuck, the probability of occurring the difference among the spaced distances and amounts of photoresist coated, upon employing the coater chuck present in the coating apparatus according to the related art.

As shown in FIGS. 1 and 2, the coating apparatus according to the related art may include a coater chuck 13 made of aluminum (Al). The coater chuck is connected to a servo motor 17 via a driving shaft 15 which is upwardly movable. Here, a surface-treated layer 13a for preventing the generation of static electricity is formed on the coater chuck 13. Since the aluminum is electrified with the slit nozzle to generate static electricity, sparkling may occur upon dispersing a photoresist through the slit nozzle. Thus, the surface-treated layer 13a is formed to prevent the occurrence of the sparkling.

Also, a chuck holder 19 for holding the coater chuck 13 is disposed at an upper end of the driving shaft 15.

A glass substrate 11 coated with the photoresist is placed on the coater chuck 13, and a slit nozzle 21 for dispersing the photoresist is located above one side of the glass substrate 11 with a preset distance. Here, the slit nozzle 21 disperses a photoresist 23 onto the glass substrate 11 for coating while moving from one end to another end of the glass substrate 11.

With the configuration of the coating apparatus according to the related art, the servo motor 17 drives the driving shaft 15. The coater chuck 13 is moved upwardly in response to the driving of the driving shaft 15, and the glass substrate 11 is then placed on the coater chuck 13. The slit nozzle 11 disposed above the one side of the glass substrate 11 with the preset distance then moves from one end to another end of the glass substrate 11, thereby dispersing the photoresist 23 on the surface of the glass substrate 11 for coating.

However, the use of the coater chuck disposed in the coating apparatus employed for the photoresist coating process according to the related art has several problems.

The coater chuck for the coating apparatus employed for the photoresist coating process according to the related art is made of aluminum. Also, the glass substrate used in an LCD device fabrication process is large. Accordingly, in order to support the large glass substrate, a large coater chuck is needed. However, the thickness T1 of the aluminum making the large coater chuck, as shown in FIG. 2, is as thin as about 15 mm as compared to the size thereof. As a result, the side portions of the coater chuck 13, as shown in FIG. 3, are sunk downwardly.

As the side portions of the coater chuck 13 are sunk downwardly, as shown in FIG. 4, the difference among spaced distances G1, G2 and G2 between the slit nozzle 21 and the coater chuck 13 is caused, which results in an uneven distribution of the photoresist dispersed through the slit nozzle on the entire surface of the glass substrate 11. That is, the downward sinking of the side portions of the coater chuck 13 also causes the difference among the distance G2 between a central portion of the coater chuck 13 and the slit nozzle 21 and the distances G1 and G3 between both side portions of the coater chuck 13 and the slit nozzle 21. In particular, referring to FIG. 4, if the coater chuck 13 is formed of aluminum, the probability that the spaced distances between the slit nozzle 21 and the side portions of the coater chuck 13 are farther than the spaced distance between the slit nozzle 21 and the central portion of the coater chuck 13 is shown higher by about 50.3%.

Accordingly, the amounts of the photoresist dispersed onto the central portion and the side portions of the coater chuck become different, thereby causing an uneven coating of the photoresist. So, more photoresist is needed to be dispersed for a satisfactory photoresist coating, and responsively the speed that the slit nozzle moves becomes slower. Here, if the slit nozzle is kept moving fast, the photoresist coating uniformity on the entire glass substrate is deteriorated, so the moving speed of the slit nozzle is made slow enough to achieve a satisfactory photoresist coating result.

As such, due to the downward sinking of the side portions of the coater chuck made of aluminum, the photoresist is not difficult to be evenly dispersed on each position of the glass substrate and additionally a larger amount of photoresist is required, which makes the moving speed of the slit nozzle slow, resulting in increase in the time taken for performing the entire photoresist coating process.

Hence, the related art coating apparatus using the coater chuck made of the aluminum is difficult to evenly disperse the photoresist on each position of the glass substrate due to the downward sinking of the side portions of the aluminum coater chuck, and accordingly requires more photoresist. As a result, the speed that the slit nozzle moves becomes slower, thereby delaying the entire time of the photoresist coating process, resulting in increase in a material cost annually consumed.

SUMMARY

A coating apparatus includes a coater chuck comprising: a driving shaft via a servo motor; a driving motor being movable up and down; and a coater chuck made of stone and connected to the driving shaft via the servo motor, a glass substrate is placed on the coater chuck, the glass substrate is coated with a photoresist through a slit nozzle.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of a coater chuck for a coating apparatus in accordance with the preferred embodiments of the present invention, with reference to the accompanying drawings.

Figure 1:
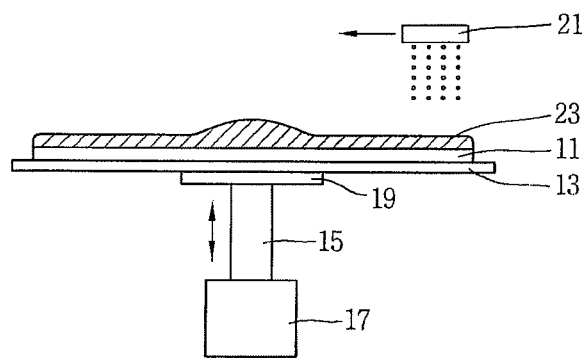
FIG. 1 is an overview schematically showing a coating apparatus used in a coating process according to the related art.
Figure 2:
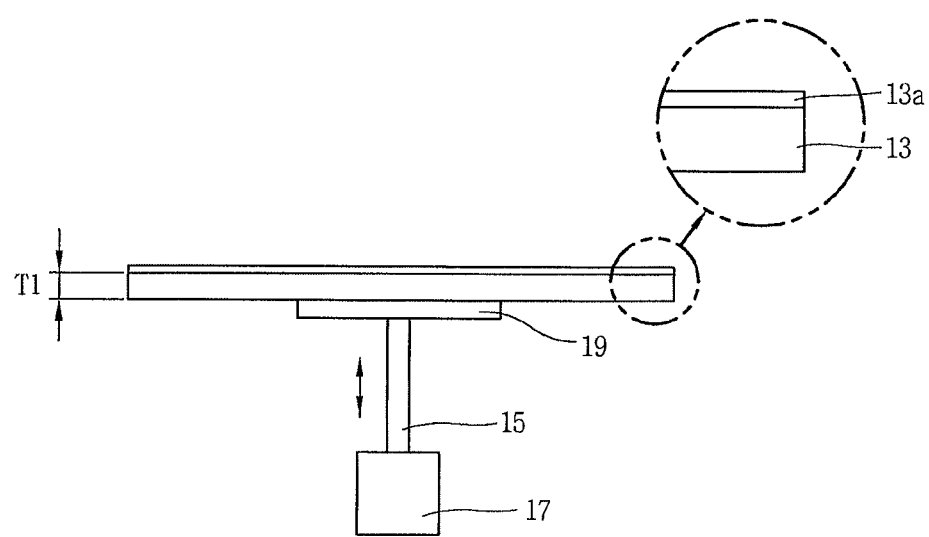
FIG. 2 is an enlarged overview of a coater chuck present in the coating apparatus used in the coating process according to the related art.
Figures 3, 4:
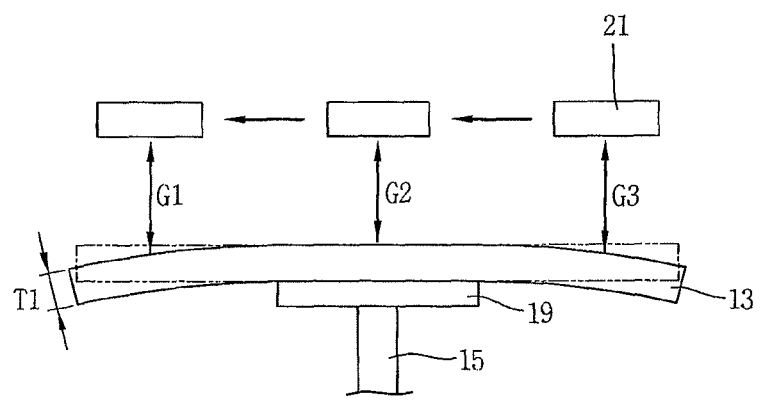
FIG. 3 is an overview showing distances spaced between the coater chuck and a slit nozzle provided in the coating apparatus according to the related art.
FIG. 4 is a table showing is a table showing spaced distances between the slit nozzle and the coater chuck, the probability of occurring the difference among the spaced distances and amounts of photoresist coated, upon employing the coater chuck present in the coating apparatus according to the related art.
Figure 5:
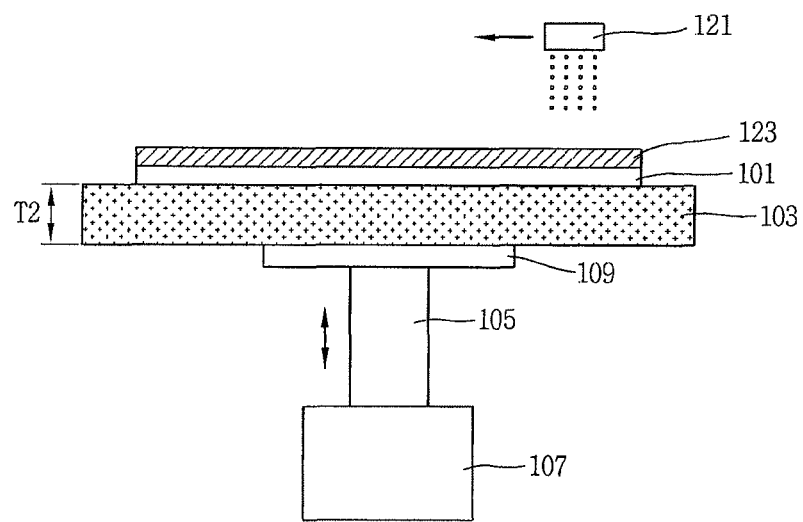
FIG. 5 is an enlarged overview of a coating apparatus having a coater chuck used in a coating process in accordance with an embodiment of the present invention.

FIG. 5 is an enlarged overview of a coating apparatus having a coater chuck used in a coating process in accordance with an embodiment of the present invention.

Figure 6:
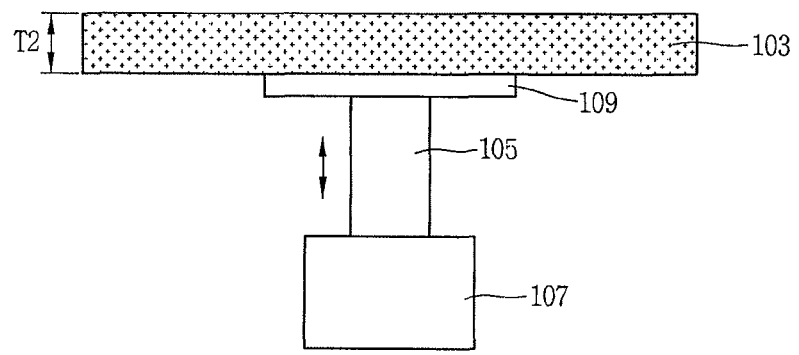
FIG. 6 is an enlarged overview of the coating apparatus having the coater chuck used in the coating process in accordance with an embodiment of the present invention.

FIG. 6 is an enlarged overview of the coating apparatus having the coater chuck used in the coating process in accordance with an embodiment of the present invention.

Figures 7, 8:
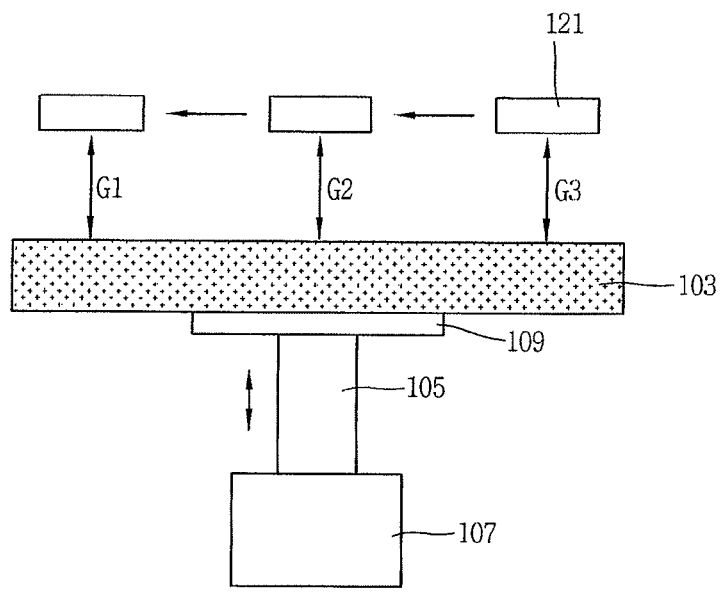
FIG. 7 is an overview showing spaced distances between the coater chuck and a slit nozzle present in the coating apparatus in accordance with an embodiment of the present invention.
FIG. 8 is a table showing spaced distances between a slit nozzle and the coater chuck, the probability of occurring the difference among the spaced distances and amounts of photoresist coated, upon employing the coater chuck present in the coating apparatus according to an embodiment of the present invention.
Figure 9:
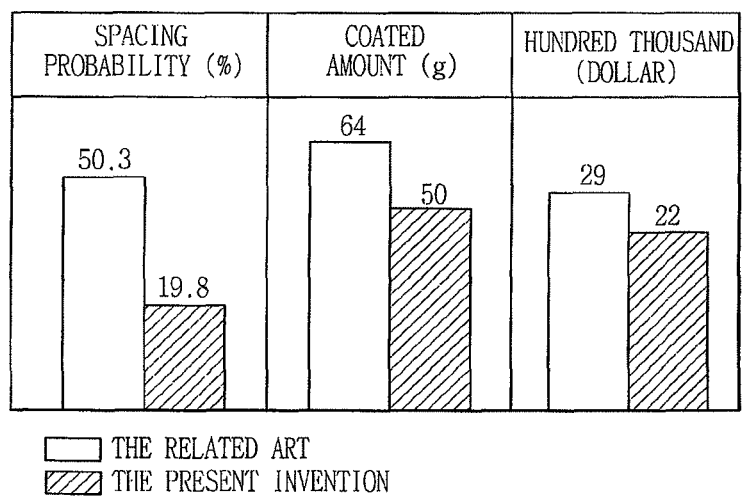
FIG. 9 is a graph showing the probability of occurring the difference among the spaced distances, amounts of photoresist coated, and a material cost required at the coating process, upon employing the coater chuck present in the coating apparatus according to an embodiment of the present invention.

FIG. 7 is an overview showing spaced distances between the coater chuck and a slit nozzle present in the coating apparatus in accordance with an embodiment of the present invention;

FIG. 8 is a table showing spaced distances between a slit nozzle and the coater chuck, the probability of occurring the difference among the spaced distances and amounts of photoresist coated, upon employing the coater chuck present in the coating apparatus according to an embodiment of the present invention; and FIG. 9 is a graph showing the probability of occurring the difference among the spaced distances, amounts of photoresist coated, and a material cost required at the coating process, upon employing the coater chuck present in the coating apparatus according to an embodiment of the present invention.

A coating apparatus according to the present invention, as shown in FIGS. 5 and 6, may include a coater chuck made of stone. The coater chuck may be connected to a servo motor 107 via a driving shaft 105 which is movable upwardly and downwardly.

Here, the servo motor 107 has a capacity of about 740 W larger than the existing small capacity of about 400 W, and the driving shaft 105 is formed different from the existing one in association with the servo motor 105 having a larger capacity than the existing capacity.

Also, the stone of the coater chuck 103 may be granite. Alternatively, the coater chuck 103 may be made of other stone or other materials, as well as the granite. Here, the coater chuck 103 may preferably be made of any material, which includes a material which is not easy to be thermally deformed, namely, has a low thermal conductivity, a material having the hardness equal to or higher than glass, a non-magnetic material without electric conductivity, and a material having a corrosion resistance against acid, alkali and other organic compounds (e.g., photoresist, etc.). Thus, the increase in the weight of the coater chuck 103 present in the coating apparatus according to the present invention can derive minimization of a vibration transferred to a coater, thereby allowing an even dispersion of a photoresist on a glass substrate 101.

In particular, preferably, the stone for making the coater chuck 103 is more than about 15 mm in thickness T2 and processed to have a surface roughness in the range of about ±30 μm. Also, the stone has undergone a polishing processing for increasing the evenness thereof, but does not separately need a surface-treated layer for preventing the generation of static electricity, as shown in the related art. Preferably, the thermal conductivity of the stone is less than about 45.0 Kcal.m.h.° C. and the corrosion resistance thereof is more than Mohs hardness of 6 or HS hardness of 40.

In the meantime, a chuck holder 109 for holding the coater chuck 103 may be disposed at an upper end of the driving shaft 105.

The glass substrate 101 coated with the photoresist may be placed on the coater chuck 103, and a slit nozzle 121 for dispersing the photoresist may be disposed above one end of upper of the glass substrate 101 with a preset distance spaced from the substrate 101. Here, the slit nozzle 121 moves from one end to another end of the glass substrate 101 to disperse the photoresist 123 so as to coat the glass substrate 101.

With the configuration of the coating apparatus according to the present invention, the servo motor 107 drives the driving shaft 105. The coater chuck 103 is then upwardly moved responsive to the driving of the driving shaft 105 and the glass substrate 101 is placed on the servo motor 107. The slit nozzle 121 which is located above the one end of upper of the glass substrate 101 then disperses the photoresist on the surface of the glass substrate 101 for coating the same.

Since the glass substrate 101 coated with the photoresist 123 is large in size, the existing aluminum coater chuck has been sunk to make it difficult to achieve a uniform dispersion of the photoresist on the entire glass substrate 101. Hence, the present invention creates the coater chuck 103 using the granite, which is thicker than the aluminum, is hard to be thermally deformed, has a high hardness and is a non-magnetic substance, and such allows maintenance of the evenness of the coater chuck 103, thereby enabling the photoresist to be uniformly coated.

That is, as shown in FIG. 7, the coater chuck 103 made of the granite is not thermally deformed and has a high hardness, so its sinking can be prevented even if the large glass substrate 101 is placed on the upper surface thereof. Hence, the probability of occurring the difference among a distance G2 between the central portion of the coater chuck 103 and the slit nozzle 121 and distances G1 and G3 between the left and right side portions of the coater chuck 103 and the slit nozzle 121 is as low as about 19.8%, as shown in FIG. 8.

Also, since the photoresist can be uniformly coated on the glass substrate 101 and the photoresist coating uniformity can be maintained even if the slit nozzle moves fast, the process time taken to perform the photoresist process can be reduced that much. Also, since about 50 g of the photoresist coated is required, as shown in FIGS. 8 and 9, 14 g of photoresist can be saved as compared to the related art.

The present invention can also reduce the photoresist coating process time by using the coater chuck made of stone, the material cost consumed for the photoresist coating process, as shown in FIG. 9, can be decreased by about five hundred thousand dollars upon being applied to a mass production, as compared to the related art.

As described above, the coater chuck disposed in the coating apparatus according to the present invention is made of stone, e.g., granite, so as to be hard to be thermally deformed, be stronger than the glass substrate in hardness, have no or low magnetism and electric conductivity, and have a strong corrosion resistance against organic compounds, such as the photoresist. In particular, since the coater chuck is hard to be thermally deformed, the sinking of the coater chuck may not occur as done in the related art. Accordingly, the spaced distances between the slit nozzle and the coater chuck can be constantly retained, thereby allowing the photoresist to be uniformly coated on the glass substrate through the slit nozzle.

Hence, the coater chuck can be prevented from being sunk so as to maintain its evenness, which urges the photoresist dispersion through the slit nozzle to be kept performed at a fast speed, thereby shortening the entire photoresist coating process time, resulting in reduction of the amount of the photoresist coated.

Therefore, the reduction of the photoresist coating process time by virtue of the coater chuck made of the stone can derive a remarkable reduction of a material cost required for the photoresist coating process upon application to a mass production.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A coating apparatus having a coater chuck comprising:
a driving shaft via a servo motor;
a servo motor being movable up and down; and
a coater chuck connected to the driving shaft by the servo motor, and on which a glass substrate being coated with a photoresist through a slit nozzle, being placed,
wherein the coater chuck is formed by using one selected from a stone being granite, a material which is not easy to be thermally deformed and having a low thermal conductivity, a material having the hardness equal to or higher than glass, a non-magnetic material without electric conductivity, and a material having a corrosion resistance against acid, alkali and other organic compounds,
wherein the coater chuck is more than 15mm in thickness to prevent sinking downwardly of the side portions of the coater chuck in performing a photoresist coating process and has a surface roughness in the range of ±30μm,
wherein the servo motor has a capacity of 740 W larger than 400 W.

2. The coating apparatus of claim 1, wherein the thermal conductivity of the stone is less than 45.0 Kcal.m.h.° C. and the corrosion resistance thereof is more than Mohs hardness of 6 or HS hardness of 40.

3. A coating apparatus having a coater chuck comprising:
a driving shaft via a servo motor;
a servo motor being movable up and down;
a coater chuck connected to the driving shaft by the servo motor, and on which a glass substrate being coated with a photoresist through a slit nozzle, being placed; and
a chuck holder for holding the coater chuck and disposed at an upper end of the driving shaft, wherein the coater chuck is formed by using one selected from a stone being granite, a material which is not easy to be thermally deformed and having a low thermal conductivity, a material having the hardness equal to or higher than glass, a non-magnetic material without electric conductivity, and a material having a corrosion resistance against acid, alkali and other organic compounds,
wherein the coater chuck is more than 15mm in thickness to prevent sinking downwardly of the side portions of the coater chuck in performing a photoresist coating process and has a surface roughness in the range of ±30μm,
wherein the servo motor has a capacity of 740 W larger than 400 W.

4. The coating apparatus of claim 3, wherein the thermal conductivity of the stone is less than 45.0 Kcal.m.h.° C. and the corrosion resistance thereof is more than Mohs hardness of 6 or HS hardness of 40.

* * * * *